(12) United States Patent
Miaw

(10) Patent No.: US 6,757,148 B2
(45) Date of Patent: Jun. 29, 2004

(54) ELECTRO-STATIC DISCHARGE PROTECTION DEVICE FOR INTEGRATED CIRCUIT INPUTS

(75) Inventor: Jiunn-Way Miaw, Hsin-Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 181 days.

(21) Appl. No.: 10/123,411

(22) Filed: Apr. 17, 2002

(65) Prior Publication Data

US 2003/0197997 A1 Oct. 23, 2003

(51) Int. Cl.[7] ................................................ H02H 9/00
(52) U.S. Cl. ...................................... 361/111; 361/56
(58) Field of Search ........................ 361/54, 56, 91.1, 361/91.5, 111, 115, 117, 118; 257/355, 356; 327/310

(56) References Cited

U.S. PATENT DOCUMENTS

| | | | |
|---|---|---|---|
| 5,612,790 A | * | 3/1997 | Sakamoto et al. ............ 386/69 |
| 6,222,710 B1 | * | 4/2001 | Yamaguchi ................... 361/56 |
| 6,608,744 B1 | * | 8/2003 | Kato ........................... 361/111 |
| 6,621,673 B2 | * | 9/2003 | Lin et al. ....................... 361/56 |
| 2002/0181177 A1 | * | 12/2002 | Ker et al. ..................... 361/56 |
| 2003/0072116 A1 | * | 4/2003 | Maloney et al. .............. 361/56 |
| 2003/0076639 A1 | * | 4/2003 | Chen ........................... 361/56 |
| 2003/0147188 A1 | * | 8/2003 | Hisaka ........................ 361/56 |

* cited by examiner

*Primary Examiner*—Jonathan Salata
(74) *Attorney, Agent, or Firm*—Rosenberg, Klein & Lee

(57) ABSTRACT

ESD protection device for integrated circuit includes: A MOS transistor is connected between a supply potential and a ground potential for PD and ND ESD modes. A first-level protection device, such as a field oxide device, has an input terminal coupled to the input pad and an output terminal coupled to the ground potential. The output terminal of the first-level protection device is shared with the MOS transistor for saving layout area. The first-level protection device provides passing the ESD current from the input pad into the MOS transistor when the ground potential is floating.

14 Claims, 5 Drawing Sheets

ELECTRO-STATIC DISCHARGE PROTECTION DEVICE FOR INTEGRATED CIRCUIT INPUTS

BACKGROUND OF THE INVENTION

1. Field of the Invention

The invention relates to integrated circuit devices, and more particularly relates to a device for protecting an integrated circuit from damage which can be caused by electro-static discharge into an input terminal.

2. Description of the Prior Art

A chronic problem associated with semiconductor integrated circuits is the destruction which can be caused by electrostatic discharge (ESD) into any one of the external connector pins. A common solution to the problem is when electrostatic discharge intrudes in the die, the electrostatic discharge could flow into a ground terminal to protect interior circuit from damage.

One of conventional layouts to create such a shunt path is shown in FIG. 1. A pull-up transistor 105 has an input node coupled to the pad 101 of the integrated circuit chip and the other two input nodes coupled to the supply potential $V_{DD}$ of the chip. A pull-down transistor 106 has an input node coupled to the pad 101 and the other two input nodes coupled to the ground potential $V_{SS}$ of the chip. A resistor 107 has a terminal coupled to the pull-up transistor 105, the pad 101, and the pull-down transistor 106, and the other terminal coupled to the input stage of the integrated circuit chip. A second-stage transistor 103 has an input node coupled to the input stage and the other two input nodes coupled to the ground potential $V_{SS}$ of the chip.

Another of conventional layouts to create such a shunt path, especially for high voltage devices, is shown in FIG. 2. A field oxide device (FOD) 102 has an input node coupled to the pad 101 of the integrated circuit chip and the other input node coupled to the ground potential $V_{SS}$ of the chip. A resistor 104 has a terminal coupled to the pad 101 and the field oxide device 102, and the other terminal coupled to the input stage of the integrated circuit chip. A second-stage transistor 103 has an input node coupled to the input stage and the other two input nodes coupled to the ground potential $V_{SS}$ of the chip. On consideration of electro-static discharge (ESD) protection performance, a FOD type ESD device needs smaller layout area than a MOS type ESD device does.

However, there are several disadvantages for the FOD type protection device. First, the FOD usually has a long channel length for avoiding the leakage current in a normal operation mode, which results in a low turn-on speed and further ESD failure in an ESD machine model. Second, when the protection mechanism of the POD is triggered by an n+/p junction breakdown, enormous heat occurs at the cylindrical junction of the POD and thus reduces the ESD level. Third, the POD implemented by a LOCOS process has better performance than one by a STI (Shallow Trench Isolation) process. Unfortunately, STI is extensively used in sub-micron (less than 0.25 um) or deep sub-micron technology, so that the performance of the POD is poor. In addition, when the FOD is used in the ESD protection device, there is no corresponding pull-up ESD protection device in the MOS type protection device. Thus, ESD tests of ND mode ("negative" electrostatic is discharged from an input terminal to $V_{DD}$) and PD mode ("positive" electro- static is discharged from the input terminal to $V_{DD}$) wouldn't be efficiently executed with the POD type protection device.

SUMMARY OF THE INVENTION

It is a principal object of the present invention to provide a protection device for integrated circuits. The performance of ESD tests of ND and PD modes of a POD type ESD protection device are improved with a component building up an effective and short electrical path.

It is another object of the present invention to provide an ESD protection device with less layout area in cooperated with ESD tests of strengthened ND and PD modes.

It is further object of the present invention to provide a FOD type protection device with improved effective junction area by adding structures of polysilicon square on the FOD device. The structures of polysilicon square further avoid junction overheat and poor turn-on characteristics.

In the present invention, an ESD (Electro-Static Discharge) protection device is for an integrated circuit having an input pad. The ESD protection device comprises a pull-up means, such as a MOS transistor, connected between a supply potential and a ground potential of the integrated circuit for PD and ND ESD modes. A first-level protection means, such as a field oxide device, has an input terminal coupled to the input pad and an output terminal coupled to the ground potential. The output terminal of the first-level protection is shared with the pull-up means for saving layout area. The first-level protection means provides passing an ESD current from the input pad into the pull-up means with the ground potential is floating.

BRIEF DESCRIPTION OF THE DRAWINGS

A better understanding of the invention may be derived by reading the following detailed description with reference to the accompanying drawings wherein.

DESCRIPTION OF THE PREFERRED EMBODIMENT

While the invention is described in terms of a single preferred embodiment, those skilled in the art will recognize that many devices described below can be altered as well as other substitutions with same function and can be freely made without departing from the spirit and scope of the invention.

Furthermore, there is shown a representative portion of layout or equivalent circuit of the present invention in enlarged. The drawings are not necessarily to scale for clarify of illustration and should not be interpreted in a limiting sense. Furthermore, the present invention can be applied on other ESD protection devices.

In the present invention, an ESD (Electro-Static Discharge) protection device is for an integrated circuit provided in a substrate having an input pad. The ESD protection device comprises a field oxide device having an input terminal coupled to the input pad and an output terminal coupled to a ground potential of the integrated circuit. A semiconductor device, such as a MOS transistor, has a first terminal connected to a supply potential and a second terminal in the substrate. The second terminal of the semiconductor device is shared with the output terminal of the field oxide device and coupled to the ground potential, whereby an ESD current from the pad passes through the semiconductor device via the field oxide device when the ground potential is floating. The semiconductor device, such as a clamping MOS can strengthen PD and ND ESD modes for ESD protection device.

Figure 1:
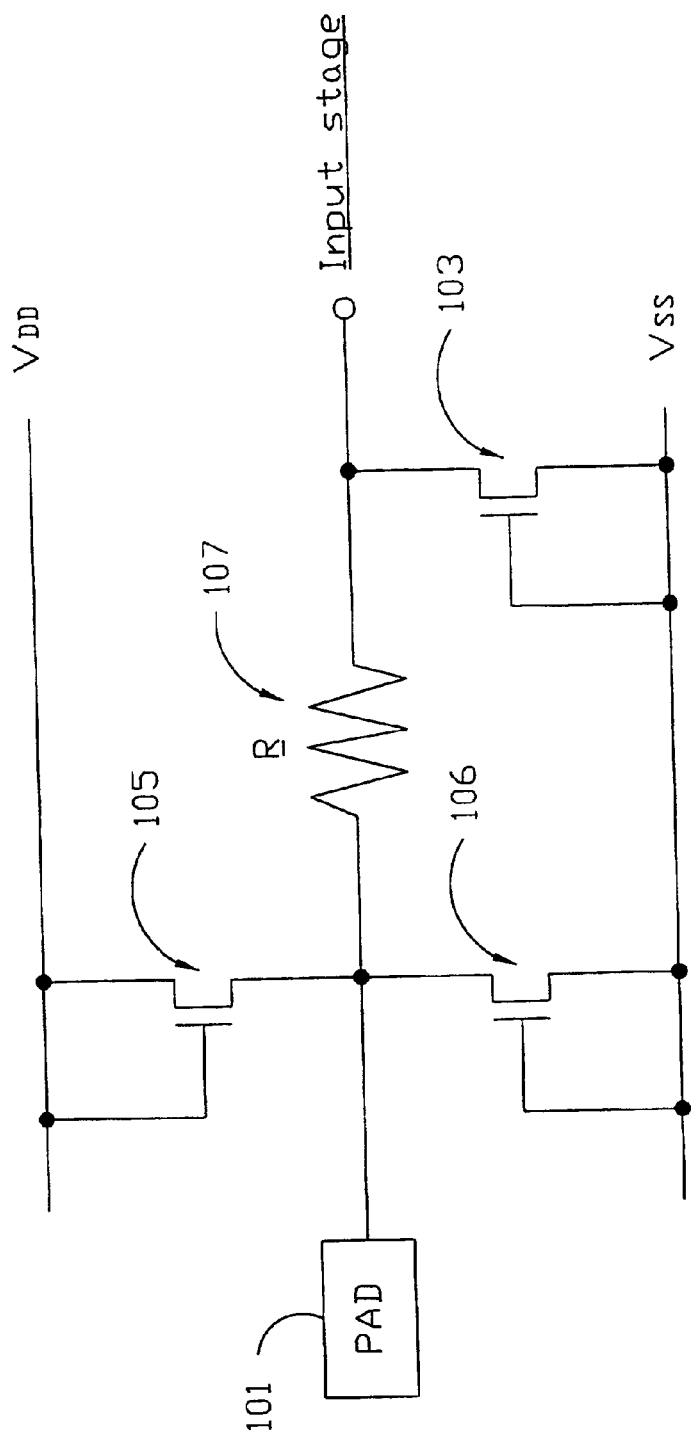
FIG. 1 is the schematic diagram of an equivalent circuit illustrating an ESD protection device in accordance with the prior art.
Figure 2:
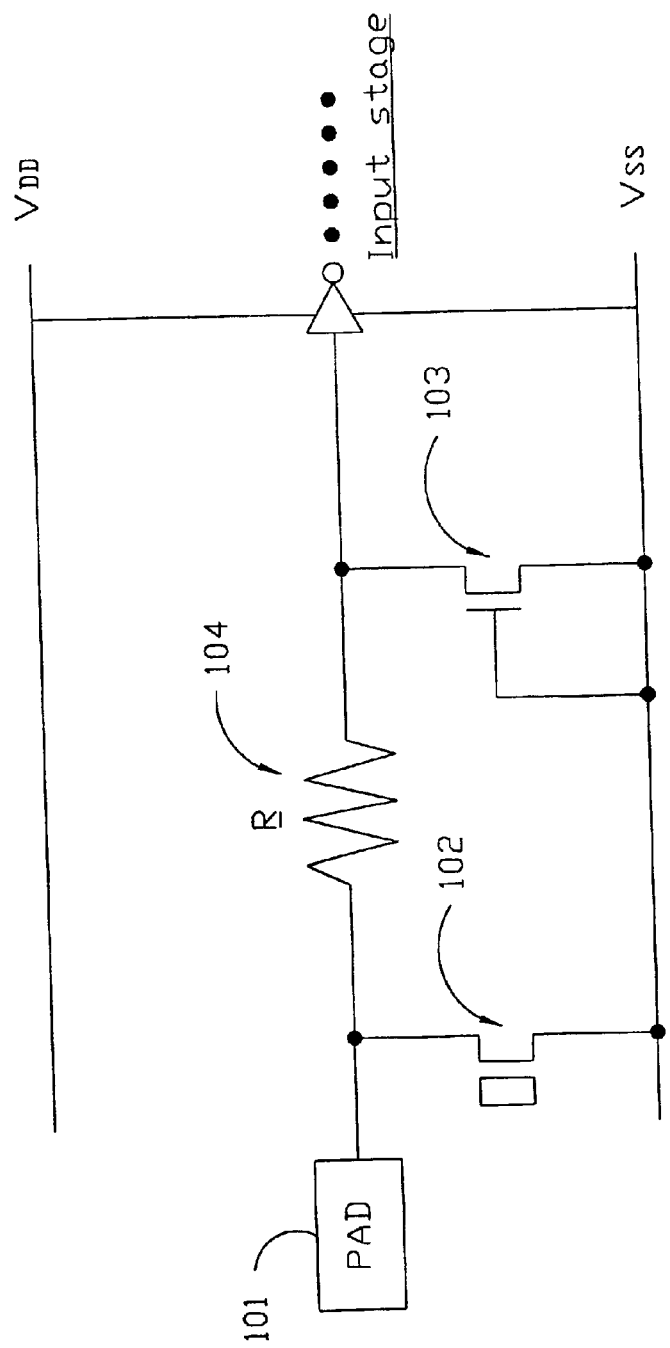
FIG. 2 is the schematic diagram of an equivalent circuit illustrating another ESD protection device in accordance with the prior art.
Figure 3:
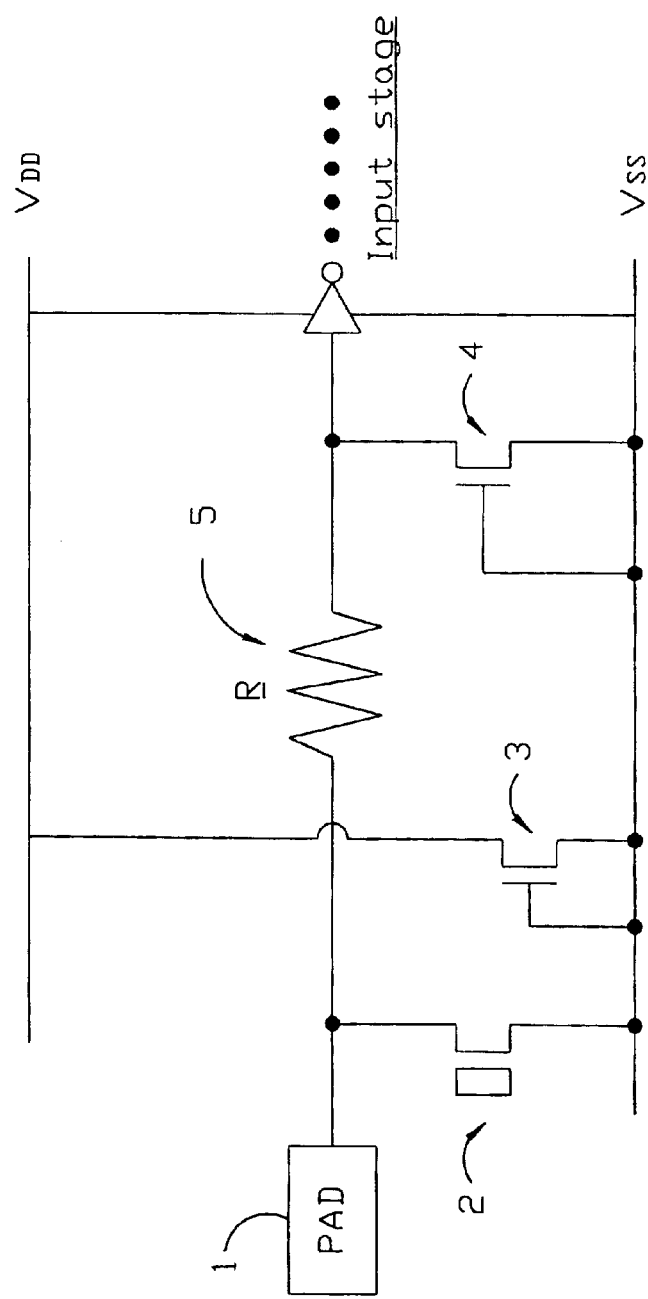
FIG. 3 is the schematic diagram of an equivalent circuit illustrating a FOD type ESD protection device in accordance with the present invention.

FIG. 3 is the schematic diagram of an equivalent circuit illustrating a FOD type ESD protection device in accordance with the present invention. A field oxide device (FOD) 2 has a terminal, such as a drain terminal, coupled to the pad 1 of the integrated circuit chip and the other terminal, such as a source terminal, coupled to the ground potential $V_{SS}$ of the chip. The field oxide device 2 acting as the first protection device can be one formed by a LOCOS process or a STI process. Furthermore, in the present invention, the drain terminal of the field oxide device 2 is used for the pin protection of high voltage input and has high breakdown voltage junction. A resistor 5 has a terminal coupled to the pad 1 and the drain terminal of the field oxide device 2, and the other terminal coupled to the input-stage node of the integrated circuit chip. A second-stage transistor 4, such as an n-type MOS, has a terminal, such as a drain terminal, coupled to the input stage and the other two terminals, such as a source terminal and a control gate, coupled to the ground potential $V_{SS}$ of the chip. In an embodiment, the second-stage transistor 4 is applied on a high-voltage device in the integrated circuit chip and therein a channel length is almost equal to one in the field oxide device 2.

As a key feature of the present invention, an nMOS transistor 3 has a terminal, such as a drain terminal, coupled to the supply potential $V_{DD}$ and the other two terminals, such as a source terminal and a control gate, coupled to the ground potential $V_{SS}$. In the embodiment, the channel length of the nMOS transistor 3 is less than the channel length of the second-stage transistor 4 or the field oxide device 2. Furthermore, the nMOS transistor 3 has a gate oxide thinner than the second-stage transistor 4 has. There are several advantages on addition of the nMOS transistor 3. First, nMOS transistor 3 acts as a clamping nMOS by connecting both the supply potential $V_{DD}$ and the ground potential $V_{SS}$. Thus, PD and ND ESD modes of a FOD type ESD protection device are improved. Furthermore, the layout area of the FOD type ESD protection device is saved by a shared source region (not shown in FIG. 3) for the nMOS transistor 3 and the field oxide device 2.

Figure 4:
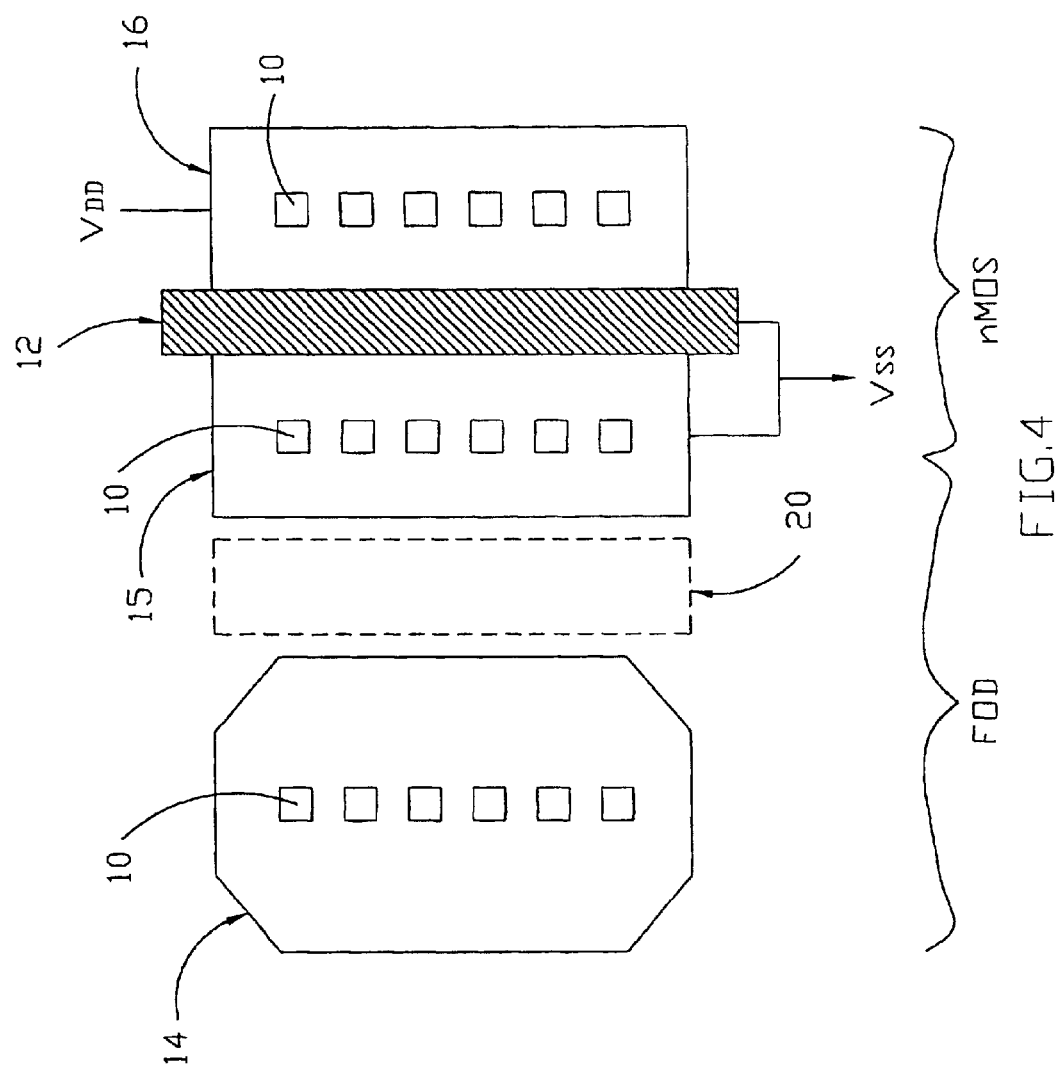
FIG. 4 is a plane view layout of a FOD type ESD protection device in one embodiment in accordance with the present invention.

FIG. 4 is a plane view layout of a FOD type ESD protection device in one embodiment in accordance with the present invention. The field oxide device has a field oxide region 20, a drain region 14 in a substrate and several contacts 10 distributed on the drain region 14. A source region 15 in the substrate is shared by the field oxide device and the nMOS transistor of the present invention. A polysilicon gate 12 of the nMOS transistor is between the source region 15 and a drain region 16. There are also several contacts 10 aligned on the source region 15 and the drain region 16. To be specific, the nMOS transistor of the present invention and the field oxide device would share the source region 15 so that the whole layout area can be saved on consideration of strengthening PD and ND ESD modes.

Figure 5:
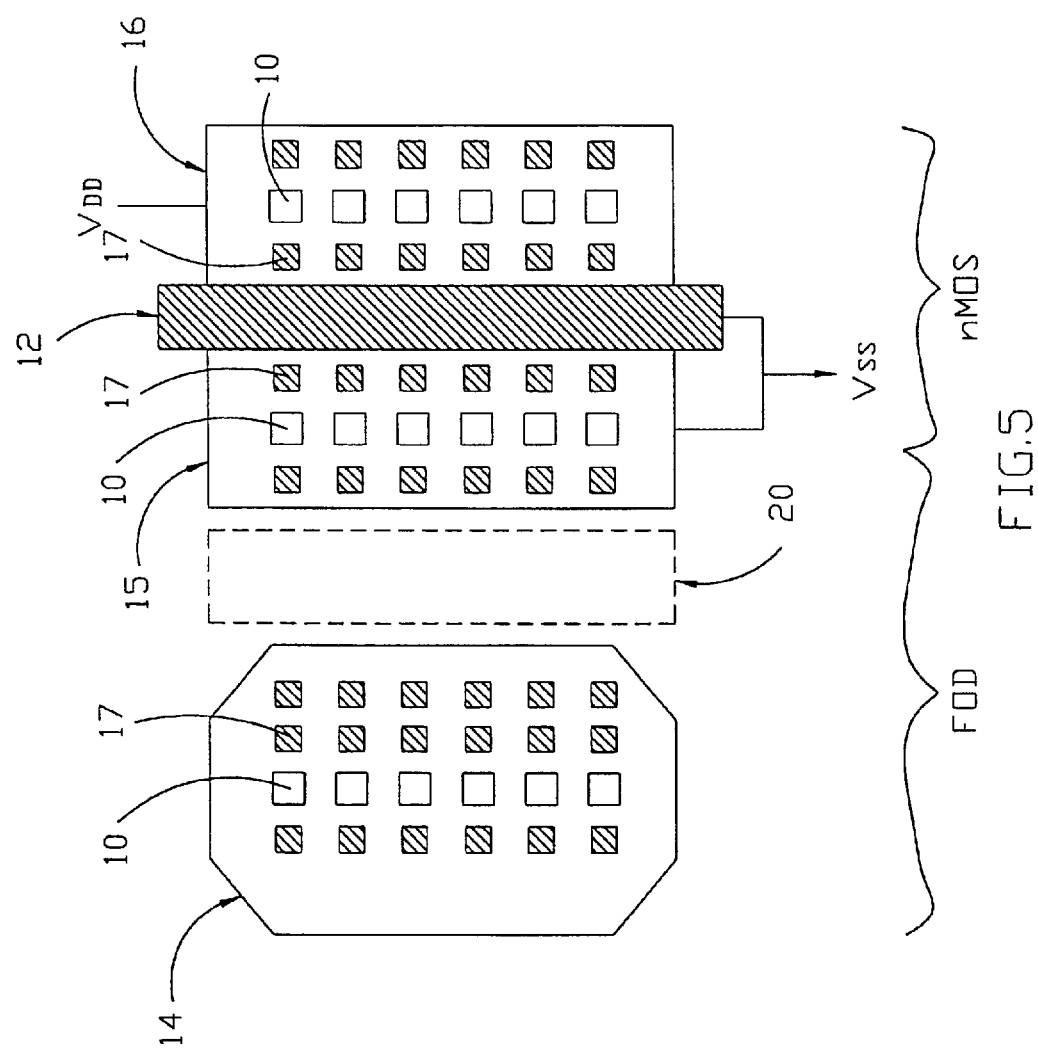
FIG. 5 is a plane view layout of a FOD type ESD protection in another embodiment in accordance with the present invention.

FIG. 5 is a plane view layout of a FOD type ESD protection in another embodiment in accordance with the present invention. Beside of the addition of the nMOS transistor similar to the embodiment in FIG. 4, there are several structures of polysilicon square 17 aligned on the active area of drain regions 14, 16, and the source region 15. These structures of polysilicon square 17 are advantageous to the FOD type ESD protection device. First, the structures of polysilicon square 17 are formed prior to the formation of the source region 15 and drain regions 14 and 16. The formation of the source and drain regions are implemented by a self-aligned process with the structures of polysilicon square 17 as an implanting mask. Thus, extra junctions are generated by the structures of polysilicon square 17 as the implanting mask. The poor turn-on characteristics due to discontinuity of the field oxide device of STI would be improved by the extra junctions. Furthermore, similar to FIG. 4, the source region 15 is shared by the nMOS transistor and the FOD device, thus the layout area is saved on consideration of strengthened ESD of ND and PD modes.

Second, the extra junctions would effectively spread ESD currents into three dimensions so that the phoneme of junction overheat on edges of the FOD can be avoided during any ESD mode. Third, the extra junctions increase the junction area (or perimeter) for ESD current and ESD level. Furthermore, the extra junctions would increase input resistance and further decrease the oscillation of ESD current in machine model ESD level. In the present invention, the geometry or dimension of the structures of polysilicon square aren't limited shown in FIG. 5.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An ESD (Electro-Static Discharge) protection device for an integrated circuit having an input pad, said ESD protection device comprising:
    a pull-up means connected between a supply potential and a ground potential of said integrated circuit, wherein said pull-up means comprises a metal-oxide-semiconductor device having a source region;
    a first-level protection means having an input terminal coupled to said input pad and an output terminal coupled to said ground potential, wherein said output terminal of said first-level protection is shared with said source region of said metal-oxide-semiconductor device, said first-level protection means for passing an ESD current from said input pad into said metal-oxide-semiconductor device when said ground potential is floating; and
    a second-level protection means having a first gate oxide layer on said substrate which is thicker than a second gate oxide layer of said metal-oxide-semiconductor device, said second-level protection means having a first terminal coupled to said input pad and a second terminal coupled to said ground potential.

2. The ESD protection device of claim 1, wherein said metal-oxide-semiconductor device has a drain region coupled to said supply potential and a gate terminal coupled to said ground potential.

3. The ESD protection device of claim 1, wherein said first-level protection means comprises a field oxide device having a drain region as said input terminal and a source region as said output terminal.

4. The ESD protection device of claim 3, wherein said field oxide device comprises a plurality of polysilicon structures distributed on said substrate and above said drain and said source regions.

5. An ESD (Electro-Static Discharge) protection device for an integrated circuit provided in a substrate having an input pad, said ESD protection device comprising:

a field oxide device having an input terminal coupled to said input pad, an output terminal coupled to a ground potential of said integrated circuit and a plurality of polysilicon structures within an active area on said substrate, wherein said input terminal is formed below said active area by implantation with said polysilicon structures as a mask; and a first semiconductor device having a first terminal connected to a supply potential and a second terminal in said substrate shared with said output terminal of said field oxide device, whereby an ESD current from said pad passes through said first semiconductor device via said field oxide device when said ground potential is floating.

6. The ESD protection device of claim 5 further comprising a second semiconductor device coupled to said input pad and said ground potential.

7. The ESD protection device of claim 6, wherein said first semiconductor device has a gate oxide layer on said substrate thinner than said second semiconductor device has.

8. The ESD protection device of claim 5, wherein said first semiconductor device comprises a plurality of polysilicon structures distributed on said substrate.

9. The ESD protection device of claim 8, wherein said first terminal is formed by implanting ions into said substrate with said polysilicon structures as a self-aligned mask.

10. The ESD protection device of claim 5, wherein said second terminal comprises a source region in said substrate and a plurality of polysilicon structures distributed above said source region.

11. The ESD protection device of claim 5, wherein said output terminal is formed below said active area by implantation with said polysilicon structures as a mask.

12. An FOD (Field Oxide Device) type ESD (Electro-Static Discharge) protection device for an integrated circuit provided in a substrate having an input pad, said FOD type ESD protection device comprising:

a field oxide region having a plurality of isolation devices on said substrate;

a first gate region on said substrate and coupled to a ground potential of said integrated circuit;

a first field region between said field oxide region and said gate region in said substrate, said first field region coupled to said ground potential;

a second field region beside said field oxide region in said substrate, said second field region coupled to said input pad;

a third field region beside said gate region in said substrate, said third field region coupled to a supply potential; and a second gate region coupled to said around potential outside of said first gate region on said substrate, wherein said second gate region has a gate oxide layer thicker than said first rate region has.

13. The FOD type ESD protection device of claim 12 wherein said first field region comprises a source portion of said field oxide region and a source portion of said first gate region.

14. The FOD type ESD protection device of claim 12, wherein there are a plurality of conductive contacts on said first, second, and third field regions.

* * * * *